United States Patent
Lai et al.

(10) Patent No.: US 11,600,788 B2
(45) Date of Patent: Mar. 7, 2023

(54) TERNARY POLYMER SOLAR CELL

(71) Applicant: NANJING UNIVERSITY OF POSTS & TELECOMMUNICATIONS, Jiangsu (CN)

(72) Inventors: Wenyong Lai, Jiangsu (CN); Jiandong Zhang, Jiangsu (CN); Bin Du, Jiangsu (CN); Wei Huang, Jiangsu (CN)

(73) Assignee: NANJING UNIVERSITY OF POSTS & TELECOMMUNICATIONS, Nanjing (CN)

( * ) Notice: Subject to any disclaimer, the term of this patent is extended or adjusted under 35 U.S.C. 154(b) by 99 days.

(21) Appl. No.: 17/118,114

(22) Filed: Dec. 10, 2020

(65) Prior Publication Data

US 2021/0104685 A1 Apr. 8, 2021

Related U.S. Application Data

(63) Continuation of application No. PCT/CN2018/111810, filed on Oct. 25, 2018.

(51) Int. Cl.
*H01L 51/42* (2006.01)
*H01L 51/00* (2006.01)
*H01L 51/44* (2006.01)

(52) U.S. Cl.
CPC ...... *H01L 51/0072* (2013.01); *H01L 51/0036* (2013.01); *H01L 51/4253* (2013.01); *H01L 51/442* (2013.01)

(58) Field of Classification Search
CPC .................. H01L 31/00–078; Y02E 10/50–60
(Continued)

(56) References Cited

U.S. PATENT DOCUMENTS

| 2014/0084266 | A1* | 3/2014 | Yang | H01L 51/442 438/82 |
| 2015/0255735 | A1 | 9/2015 | Park et al. | |
| 2018/0057428 | A1* | 3/2018 | Ong | C07C 13/567 |

FOREIGN PATENT DOCUMENTS

| CN | 104177378 A | 12/2014 |
| CN | 105006523 A | 10/2015 |

(Continued)

OTHER PUBLICATIONS

Li et al., High Performance All-Polymer Solar Cells by Synergistic Effects of Fine-Tuned Crystallinity and Solvent Annealing, J. Am. Chem. Soc., 2016, 138, 10935-10944 (Year: 2016).*

(Continued)

*Primary Examiner* — Bach T Dinh

(57) ABSTRACT

The present invention discloses a ternary polymer solar cell. A photoactive layer of the ternary polymer solar cell includes two non-fullerene electron acceptors with large planarity. The weight percentage composition of the photoactive layer in the ternary polymer solar cell is: 41.6-50% of polymer electron donor, 0-50% of polymer electron acceptor, and 0-50% of non-fullerene perylene diimide (PDI) electron acceptor. The non-fullerene PDI electron acceptor is added into the photoactive layer to broaden the spectral absorption of the photoactive layer, improve the phase separation of the photoactive layer and inhibit the recombination of bimolecular charges, resulting in more efficient generation and transport of charges, thereby increasing a short-circuit current density of the ternary polymer solar cell device, and finally improving the power conversion efficiency of the ternary polymer solar cell device. Moreover, a new direction is provided for the selection of the all-polymer non-fullerene acceptor.

8 Claims, 3 Drawing Sheets

(58) Field of Classification Search
USPC .................................................. 136/243–265
See application file for complete search history.

(56) References Cited

FOREIGN PATENT DOCUMENTS

| CN | 105185912 A | 12/2015 |
| CN | 106810540 A | 6/2017 |

OTHER PUBLICATIONS

Benten et al. High-Performance Ternary Blend All-Polymer Solar Cells with Complementary Absorption Bands from Visible to Near-Infrared Wavelengths, Energy Environ. Sci., 2016, 9, 135-140 (Year: 2016).*

* cited by examiner

TERNARY POLYMER SOLAR CELL

CROSS-REFERENCE TO RELATED APPLICATIONS

This application is a continuation of International Patent Application No. PCT/CN2018/111810, filed on Oct. 25, 2018, which claims the benefit of priority from Chinese Patent Application No. 201810629010.X, filed on Jun. 19, 2018. The content of the aforementioned applications, including any intervening amendments thereto, is incorporated herein by reference.

TECHNICAL FIELD

The present invention belongs to the technical field of photovoltaics, particularly relates to an organic polymer photovoltaic device, and more particularly to a ternary polymer solar cell.

BACKGROUND OF THE PRESENT INVENTION

At present, organic solar cells (OSCs) have broad application prospects in the technical field of photovoltaics for its advantages of light weight, translucence, good flexibility and low temperature-resistant manufacturing processes, and can be integrated into future flexible and wearable devices. So far, almost all organic solar cell devices with the highest efficiency use conjugated polymers or small molecules as electron donors and fullerenes and derivatives thereof as electron acceptors to form heterojunctions. However, due to the inherent problems of the fullerenes and derivatives thereof such as relatively weak light absorption and almost fixed chemical structures and energy levels, the open-circuit voltage ($V_{OC}$) and short-circuit current density ($J_{SC}$) of the OSC devices are further limited. Therefore, the fullerenes and derivatives thereof are not ideal electron acceptors. Furthermore, an all-polymer solar cell is composed of a polymer donor and a polymer acceptor and has better mechanical property than other non-fullerene donors and acceptors. It shows a great potential of the flexible photovoltaic devices in the future. Compared with the non-fullerene small molecular acceptor with high efficiency, the synthesis of the non-fullerene polymer acceptor and the development of device performance lag behind the non-fullerene small molecular acceptor. The non-fullerene polymer N2200 using naphthalimide (NDI) as the core is the non-fullerene polymer acceptor that is used most widely. These NDI analogues can simultaneously keep highly-ordered structure, excellent electron migration rate and strong π-π molecular interaction. However, the short-circuit current density and fill factor value of the NDI analogues are relatively lower than those of other fullerenes and derivatives thereof. The low device performance of the all-polymer solar cells includes polymer/polymer phase separation, low electron migration rate of the polymer acceptor and low-efficient charge dissociation on the donor/acceptor (D/A) interface.

In recent years, a third component has been introduced into a polymer/fullerene BHJ (bulk heterojunction) solar cell system to broaden the spectral absorption, which is considered as an effective strategy for improving the device performance of the organic solar cells, and has important significance for obtaining the high-efficiency device performance under the same film thickness. However, in the all-polymer solar cell system based on the polymer acceptor, the ternary polymer solar cell is rarely reported. Up to now, the PCE (power conversion efficiency) is relatively low. In these limited ternary polymer solar cells, only the structure with the third component as the polymer acceptor is studied. As far as we know, there is no report about the addition of the small molecule acceptor as a ""solid additive"" into the limited all-polymer solar cells. The interaction between small molecule receptors and polymers is still unknown. The influence of the combined polymer/small molecule acceptor on the properties and performance of the all-polymer solar cells needs to be further studied.

Inspired by the successful application of the ternary polymer/fullerenes and polymer/small molecule solar cells, the present invention discloses a ternary polymer system composed of a polymer donor and two non-fullerene acceptors. It is discovered that doping the non-fullerene perylene diimide electron acceptor as the third component can significantly increase the light absorption, optimize the morphology of a hybrid cell film, enhance the generation of charge carriers and balance the transport of the charge carriers in a binary compound. Therefore, the present invention not only discloses the detailed functions of the small molecule acceptor as the ""solid additive"" in the all-polymer solar cell, but also discloses that the ternary method used in the current all-polymer solar cell may become a universal and convenient way for further improving the cell efficiency.

SUMMARY OF THE PRESENT INVENTION

The purpose of the present invention is to overcome the disadvantages of the prior art, to select the third component as an electron acceptor to be matched with the existing polymer electron donor and polymer electron acceptor, and to improve the photoelectric conversion efficiency of an all-polymer solar cell. The present invention provides a ternary polymer solar cell, which aims at introducing a non-fullerene perylene diimide (PDI) electron acceptor into a polymer solar cell system to form a ternary polymer solar cell by doping. Specifically, the non-fullerene PDI electron acceptor is introduced into a photoactive layer to broaden the spectral absorption of the photoactive layer, improve the phase separation of the photoactive layer and inhibit the recombination of bimolecular charges so as to promote the generation and transport of the charges, thereby increasing the short-circuit current density of the ternary polymer solar cell device, finally improving the photoelectric conversion performance of the ternary polymer solar cell device, and preparing the ternary polymer solar cell device with high performance.

Technical solution: to realize the above purpose, the technical solution adopted by the present invention is as follows:

The present invention provides a ternary polymer solar cell. A non-fullerene PDI electron acceptor is added into a photoactive layer of a binary all-polymer solar cell as a third component. The ternary polymer solar cell includes a substrate layer, a transparent conductive cathode, a cathode buffer layer, a photoactive layer, an anode buffer layer and a metal anode successively from bottom to top. The weight percentage composition of the photoactive layer is: 41.6-50% of polymer electron donor, 0-50% of polymer electron acceptor, and 0-50% of non-fullerene PDI electron acceptor. The non-fullerene PDI electron acceptor added into the photoactive layer broadens the spectral absorption of the photoactive layer, improves the phase separation of the photoactive layer, and inhibits the recombination of bimolecular charges, thereby leading to more effective generation and transport of charges, increasing the short-circuit current density of the ternary polymer solar cell device, and finally improving the photoelectric conversion performance of the ternary polymer solar cell device.

Further, the non-fullerene PDI electron acceptor is a compound containing no fullerene group but containing PDI groups, such as 2PDINB. An absorbing band of 2PDINB is between 300 nm and 900 nm.

A structural formula of the 2PDINB is:

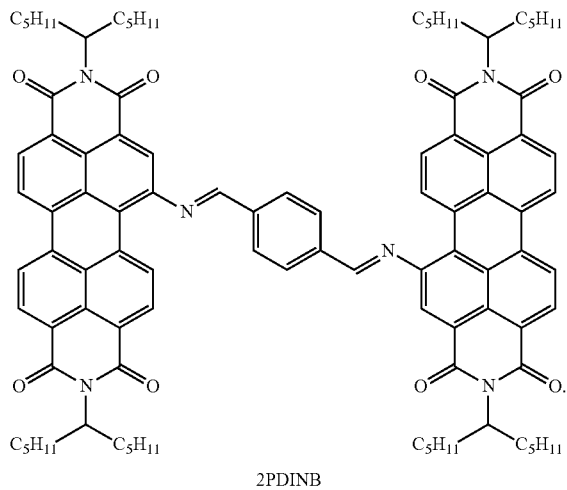

2PDINB

A preparation method of the 2PDINB includes: first, making the PDI and concentrated nitric acid react in dichloromethane for 2-4 h to generate PDI with nitro groups; then refluxing the PDI with nitro groups, iron powder and concentrated hydrochloric acid in tetrahydrofuran for 30-60 min to obtain PDI with amino groups; and finally, refluxing the PDI with amino groups, terephthalaldehyde and acetic acid in ethanol for 24-30 h to obtain 2PDINB.

Further, the preparation method of the 2PDINB includes specific steps as follows:

1) dissolving 1 g of PDI into 20 mL of dichloromethane to obtain a reagent A; dissolving 3 mL of fuming concentrated nitric acid into 5 mL of dichloromethane to obtain a reagent B; cooling the reagent A in an ice bath for 10-20 min, and then dropwise adding the reagent B into the reagent A to obtain a mixed solution; stirring the mixed solution at 0° C. for 2-4 h; pouring the mixed solution into methanol; filtering, washing and drying the mixed solution; purifying by silica column chromatography; spin drying and vacuum drying the mixed solution to obtain dark red PDI with nitro groups;

2) refluxing and stirring 1.21 g of 1.50 mmol PDI with nitro groups, 175 mg of 3.14 mmol iron powder and 6 mL of concentrated hydrochloric acid in 50 mL of anhydrous tetrahydrofuran for 30-60 min; and then cooling the solution, precipitating in deionized water, extracting, drying with anhydrous sodium sulfate, spin drying, then dissolving in chloroform, finally purifying by silica column chromatography, and concentrating by evaporation to obtain the PDI with amino groups; and 3) refluxing 714 mg of 1.00 mmol PDI with amino groups, 281 mg of 2.1 mmol terephthalaldehyde and 5 mL of acetic acid in 40 mL of ethanol for 24-30 h; and cooling, extracting with water and dichloromethane, removing the acetic acid, drying with anhydrous sodium sulfate, spin drying, and finally purifying by silica column chromatography to obtain the 2PDINB.

Further, in the photoactive layer, the weight percentage composition of the polymer electron donor, the polymer electron acceptor and the non-fullerene PDI electron acceptor is 1:(0-1):(0-1).

Further, in the photoactive layer, the material of the polymer electron donor is a narrow-band polymer electron donor, which may be one of polythiophene derivatives, such as P3HT, PTB7-Th or PBDB-T.

Further, in the photoactive layer, the material of the polymer electron acceptor is an n-type conjugated polymer electron acceptor containing naphthalimide, such as N2200.

Further, the material of the anode buffer layer is an organic compound with hole transport capacity or electron blocking capacity or a metal oxide with hole transport capacity or electron blocking capacity. A thickness of the anode buffer layer is ranged from 1 nm to 200 nm.

Further, the material of the cathode buffer layer is an organic compound with electron transport capacity or hole blocking capacity or a metal oxide with electron transport capacity or hole blocking capacity, which may be one or more of TPBi, BCP, Bphen, $Alq_3$, AZO, ZnO and $TiO_2$. A thickness of the cathode buffer layer is ranged from 1 nm to 200 nm.

Further, the material of the substrate layer is glass or a transparent polymer. The material of the transparent polymer is one or more of polyethylene, polymethylmethacrylate, polycarbonate, polyurethane, polyphthalimide, vinyl chloride resin or polyacrylic acid.

Further, the transparent conductive cathode is a conductive material that is transparent or translucent in a visible light zone. The light transmittance of the transparent conductive cathode is greater than 50%.

Further, the material of the metal anode is gold, silver, platinum, copper or aluminum.

Beneficial effects: compared with the prior art, the ternary polymer solar cell provided by the present invention has the following advantages:

1) The non-fullerene PDI electron acceptor is doped into the photoactive layer of the organic solar cell to broaden the spectral absorption of the photoactive layer, improve the phase separation of the photoactive layer and inhibit the recombination of bimolecular charges, thereby leading to more effective generation and transport of charges, increasing the short-circuit current density of the ternary polymer solar cell device, and finally improving the photoelectric conversion performance of the ternary polymer solar cell device;

2) The ternary polymer solar cell device doped with the non-fullerene PDI electron acceptor is ultra-thin. Except for the thickness of the substrate layer, an overall thickness of the ternary polymer solar cell device is not greater than 200 nm;

3) The ternary polymer organic solar cell doped with the non-fullerene PDI electron acceptor has the advantages of high photoelectric conversion performance, simple preparation technology, short preparation process and low cost.

1—substrate layer; 2—transparent conductive cathode; 3—cathode buffer layer; 4—photoactive layer; 5—anode buffer layer; and 6—metal anode.

DETAILED DESCRIPTION OF THE PRESENT INVENTION

The present invention discloses a ternary polymer solar cell, which belongs to the technical field of photovoltaics. A photoactive layer of the ternary polymer solar cell includes two non-fullerene electron acceptors with large planarity. The weight percentage composition of the photoactive layer in the ternary polymer solar cell is: 41.6-50% of polymer electron donor, 0-50% of polymer electron acceptor, and 0-50% of non-fullerene perylene diimide (PDI) electron acceptor. The non-fullerene PDI electron acceptor is added into the photoactive layer to broaden the spectral absorption of the photoactive layer, improve the phase separation of the photoactive layer and inhibit the recombination of bimolecular charges, thereby leading to more effective generation and transport of charges, increasing the short-circuit current density of the ternary polymer solar cell device, and finally improving the photoelectric conversion performance of the ternary polymer solar cell device. Moreover, a new direction is provided for the selection of the all-polymer non-fullerene acceptor. The ternary polymer solar cell formed by combining two non-fullerene electron acceptors with large planarity has the advantages of high photoelectric conversion performance, simple preparation technology, short preparation process and low cost.

The present invention is further described below in conjunction with the drawings and embodiments.

EMBODIMENTS

The present invention can be better understood on the basis of the following embodiments. However, those skilled in the art can easily understand that the specific material ratios, technological conditions and results described in the embodiments are only used to illustrate the present invention, and should not and may not limit the present invention described in detail in the claims.

Figure 2:
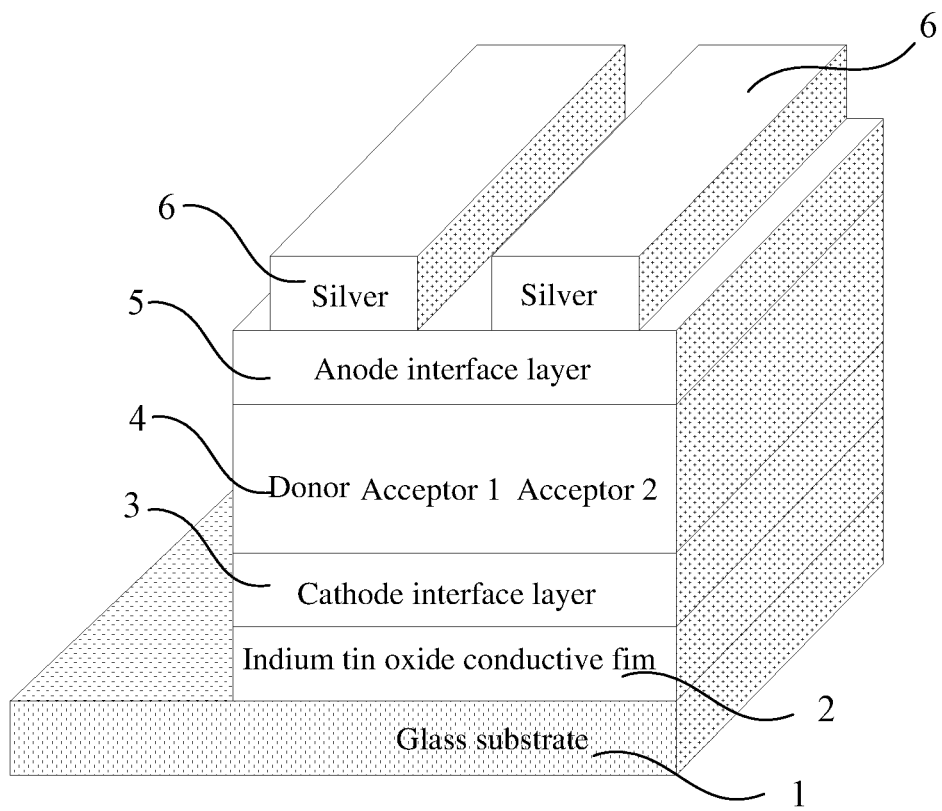
FIG. 2 is a structural schematic diagram of a ternary polymer solar cell device of the present invention.

The purpose of the present invention is to provide a ternary polymer solar cell. As shown in FIG. 2, the ternary polymer solar cell includes a substrate layer, a transparent conductive cathode, a cathode buffer layer, a photoactive layer, an anode buffer layer and a metal anode successively from bottom to top. The photoactive layer is formed by doping non-fullerene PDI electron acceptors. The weight percentage composition of the photoactive layer is: 41.6-50% of polymer electron donor, 0-50% of polymer electron acceptor, and 0-50% of non-fullerene PDI electron acceptor.

Figure 1:
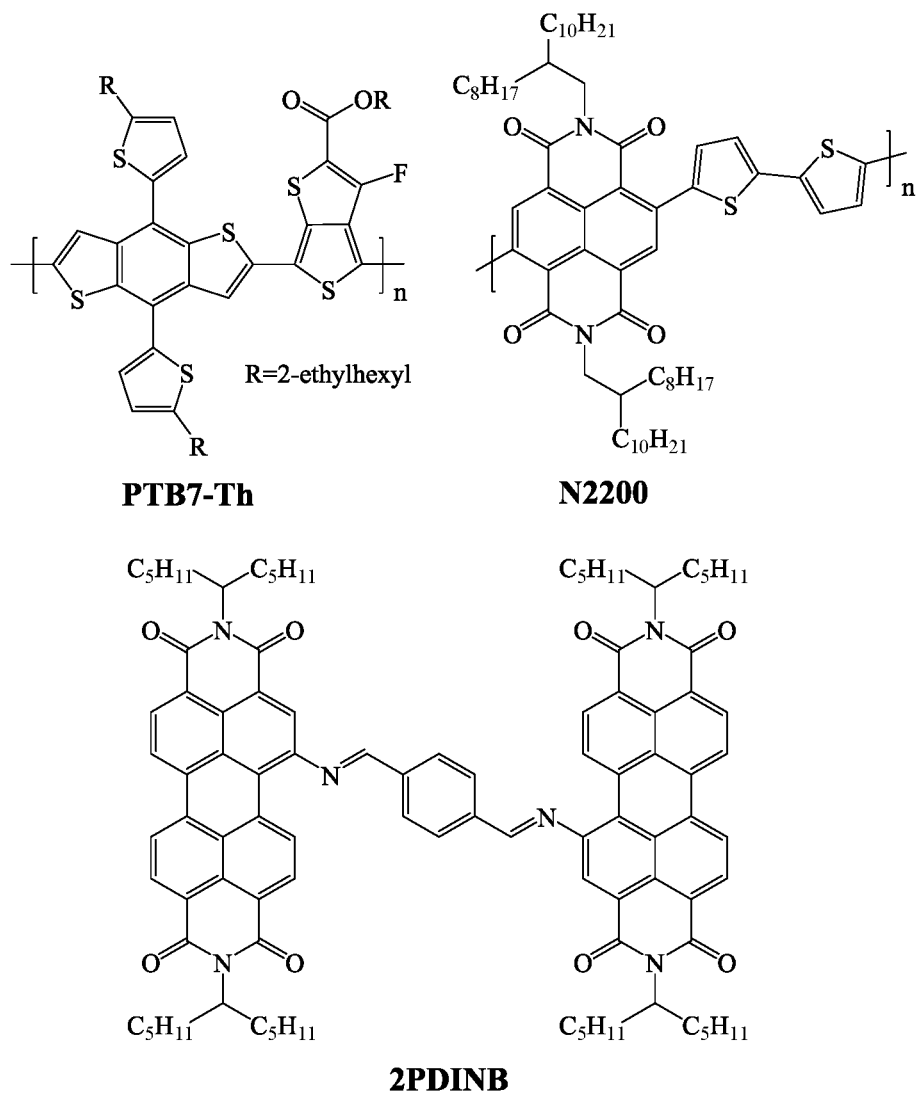
FIG. 1 shows materials used in a photoactive layer in embodiments: a polymer electron donor is PTB7-Th, a polymer electron acceptor is N2200, and a non-fullerene PDI electron acceptor with high crystallinity is 2PDINB.

In the photoactive layer, the material of the non-fullerene electron acceptor is 2PDINB. The material of the polymer electron donor is PTB7-Th. The material of the polymer electron acceptor is N2200. The corresponding structure is as shown in FIG. 1.

A preparation method of the 2PDINB is as follows: first, the perylene diimide (PDI) and concentrated nitric acid react in dichloromethane for 2-4 h to generate PDI with nitro groups; then the PDI with nitro groups, iron powder and concentrated hydrochloric acid are refluxed in tetrahydrofuran for 30-60 min to obtain PDI with amino groups; and finally, the PDI with amino groups, terephthalaldehyde and acetic acid are refluxed in ethanol for 24-30 h to obtain the 2PDINB.

Specific steps are as follows:

1) A PDI (1 g, 1.43 mmol) solution dissolved in dichloromethane (20 mL) is cooled in an ice bath for 10-20 min. Then a dichloromethane (5 mL) diluent containing fuming concentrated nitric acid (3 mL) is dropped to obtain a mixed solution. The mixed solution is stirred at 0° C. for 2-4 h. Subsequently, a resulting mixture is poured into methanol, precipitates are collected by vacuum filtering, and the precipitates are washed with water, dried, purified by silica gel column chromatography (petroleum ether/dichloromethane, 1:1 v/v), spin dried, and vacuum dried to obtain dark red PDI with nitro groups. The yield is 98%.

2) The PDI with nitro groups (1.21 g, 1.50 mmol) (dark red solution), iron powder (175 mg, 3.14 mmol) and concentrated hydrochloric acid (6 mL) are refluxed in anhydrous tetrahydrofuran (50 mL) and stirred for 30-60 min (the color is changed from dark red to dark blue 10 min later). After the reaction is ended, the mixed solution is cooled, precipitated with deionized water (250 mL) and extracted; the collected precipitates are dried with anhydrous sodium sulfate, spin dried, and then dissolved in little chloroform, and finally the precipitates are purified by silica gel column chromatography (chloroform) and concentrated by evaporation to obtain PDI with amino groups. The yield is 70%.

3) The PDI with amino groups (714 mg, 1.00 mmol), terephthalaldehyde (281 mg, 2.1 mmol) and acetic acid (5 mL) are refluxed in ethanol (40 mL) for 24-30 h. After the reaction is ended, the mixed solution is cooled and extracted with water and dichloromethane; the acetic acid is removed; and then the obtained extract is dried with anhydrous sodium sulfate, spin dried and purified by silica gel column chromatography (ethyl acetate/petroleum ether, 1:10 v/v) to obtain the 2PDINB.

An experimental route is as follows:

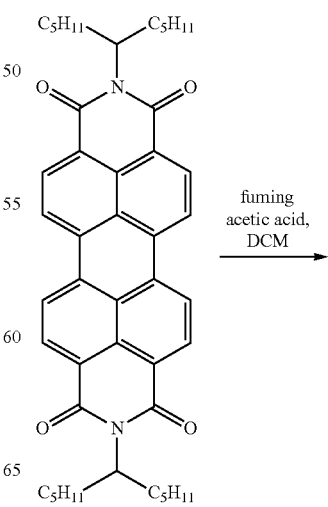

fuming acetic acid, DCM

-continued

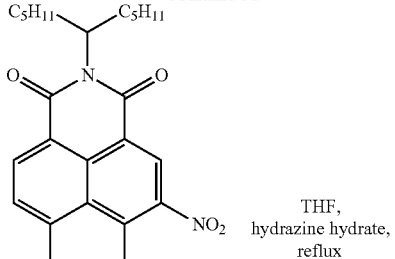

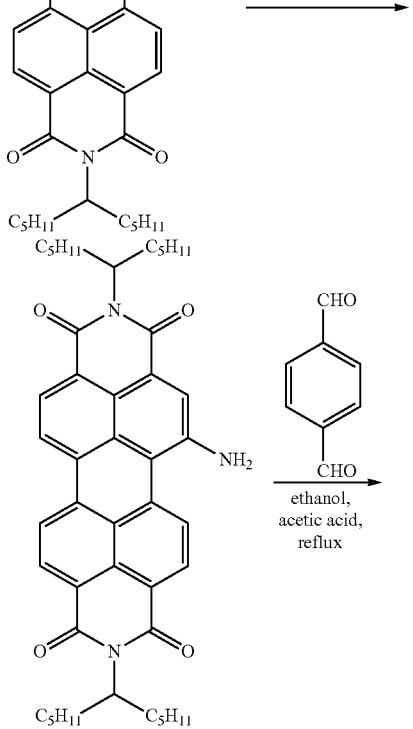

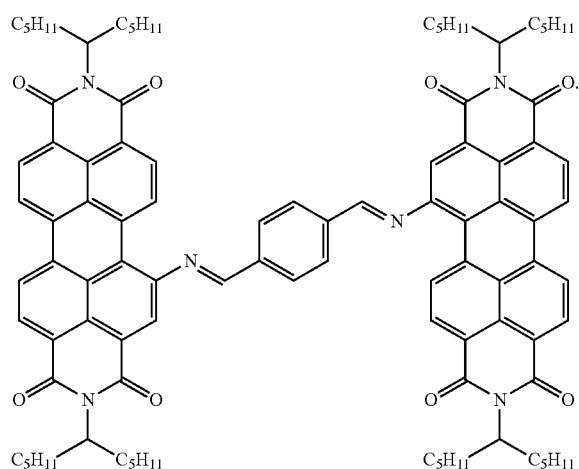

The material of the anode buffer layer is molybdenum oxide ($MoO_3$), and a thickness of the anode buffer layer is 8 nm. The material of the cathode buffer layer is zinc oxide (ZnO), and a thickness of the cathode buffer layer is 35 nm. The material of the substrate layer is a glass substrate. The material of the transparent conductive cathode is indium tin oxide (ITO). The metal anode is silver (Ag).

Embodiment 1

Control Group:

A base plate, which has surface roughness less than 1 nm, composed of a transparent substrate layer and a transparent conductive cathode ITO was washed and then dried by blowing nitrogen. The surface of the transparent conductive cathode ITO was spin coated with ZnO (4500 rpm, 40 s, 25 nm) to prepare a cathode buffer layer, and a formed film was subjected to thermal annealing (200° C., 60 min). The cathode buffer layer was spin coated to prepare a PTB7-Th: N2200 photoactive layer (2000 rpm, 60 s, 95 nm) in a mass ratio of 1:1, and the surface of the photoactive layer was evaporated with $MoO_3$ (8 nm). An anode buffer layer was evaporated with metal anode Ag (80 nm). Under standard test conditions (AM 1.5, 100 mW/cm$^2$), it was measured that the open-circuit voltage ($V_{OC}$) of the ternary polymer solar cell device was 0.80 V, the short-circuit current ($J_{SC}$) was 11.2 mA/cm$^2$, the fill factor (FF) was 0.45, and the power conversion efficiency (PCE) was 4.01%.

Embodiment 2

A base plate, which has surface roughness less than 1 nm, composed of a transparent substrate layer and a transparent conductive cathode ITO was washed and then dried by blowing nitrogen. The surface of the transparent conductive cathode ITO was spin coated with ZnO (4500 rpm, 40 s, 25 nm) to prepare a cathode buffer layer, and a formed film was subjected to thermal annealing (200° C., 60 min). The cathode buffer layer was spin coated to prepare a PTB7-Th: N2200:2PDINB photoactive layer (2000 rpm, 60 s, 95 nm) in a mass ratio of 1:1:0.1, and the surface of the photoactive layer was evaporated with $MoO_3$ (8 nm). An anode buffer layer was evaporated with metal anode Ag (80 nm). Under the standard test conditions (AM 1.5, 100 mW/cm$^2$), it was measured that the open-circuit voltage ($V_{OC}$) of the ternary polymer solar cell device was 0.80 V, the short-circuit current ($J_{SC}$) was 11.5 mA/cm$^2$, the fill factor (FF) was 0.45, and the power conversion efficiency (PCE) was 4.07%.

Embodiment 3

A base plate, which has surface roughness less than 1 nm, composed of a transparent substrate layer and a transparent conductive cathode ITO was washed and then dried by blowing nitrogen. The surface of the transparent conductive cathode ITO was spin coated with ZnO (4500 rpm, 40 s, 25 nm) to prepare the cathode buffer layer, and a formed film was subjected to thermal annealing (200° C., 60 min). The cathode buffer layer was spin coated to prepare a PTB7-Th: N2200:2PDINB photoactive layer (2000 rpm, 60 s, 95 nm) in a mass ratio of 1:1:0.2, and the surface of the photoactive layer was evaporated with $MoO_3$ (8 nm). An anode buffer layer was evaporated with metal anode Ag (80 nm). Under the standard test conditions (AM 1.5, 100 Mw/cm$^2$), it was measured that the open-circuit voltage ($V_{OC}$) of the ternary polymer solar cell device was 0.82V, the short-circuit current ($J_{SC}$) was 12.1 mA/cm$^2$, the fill factor (FF) was 0.45, and the power conversion efficiency (PCE) was 4.52%.

Embodiment 4

A base plate, which has surface roughness less than 1 nm, composed of a transparent substrate layer and a transparent conductive cathode ITO was washed and then dried by blowing nitrogen. The surface of the transparent conductive cathode ITO was spin coated with ZnO (4500 rpm, 40 s, 25 nm) to prepare a cathode buffer layer, and a formed film was subjected to thermal annealing (200° C., 60 min). The cathode buffer layer was spin coated to prepare a PTB7-Th: 2PDINB photoactive layer (1000 rpm, 30 s, 85 nm) in a mass ratio of 1:1, and the surface of the photoactive layer was evaporated with $MoO_3$ (8 nm). An anode buffer layer was evaporated with metal anode Ag (80 nm). Under the standard test conditions (AM 1.5, 100 mW/cm$^2$), it was measured that the open-circuit voltage ($V_{OC}$) of the ternary polymer solar cell device was 0.88V, the short-circuit current ($J_{SC}$) was 9.1 mA/cm$^2$, the fill factor (FF) was 0.46, and the power conversion efficiency (PCE) was 3.71%.

Figure 3:
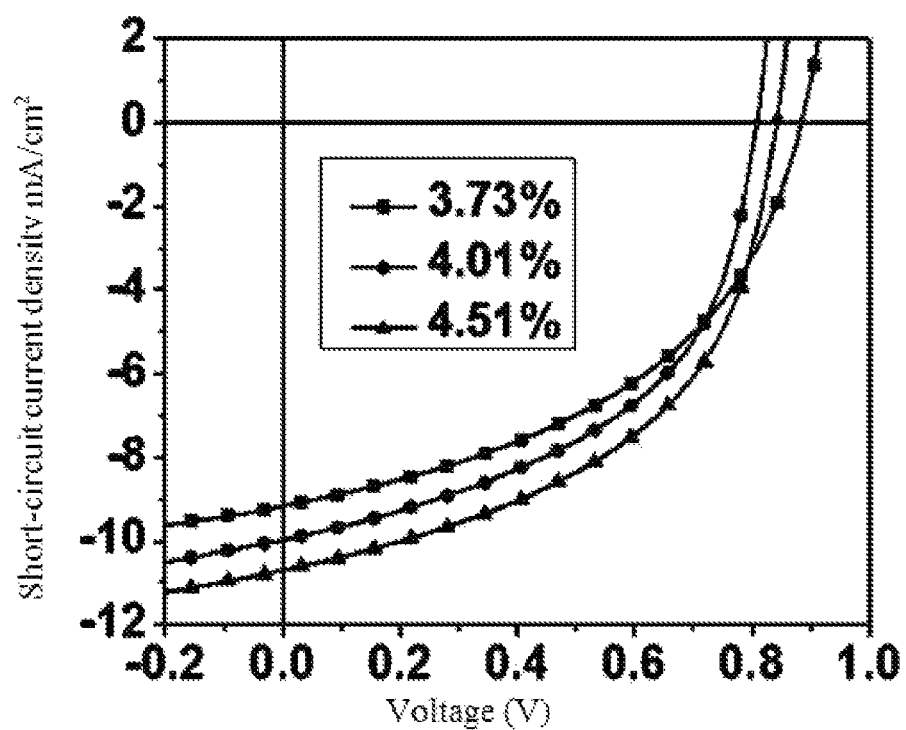
FIG. 3 is a current density-voltage characteristic curve of the ternary polymer solar cell device under the irradiation of AM 1.5 (the intensity is 100 mW/cm²) in embodiment 1 and embodiment 2.

FIG. 3 is a current density-voltage characteristic curve of the ternary polymer solar cell device under the irradiation of AM 1.5 (the intensity is 100 mW/cm$^2$) in embodiment 1 and embodiment 2. It shows that doping little non-fullerene PDI electron acceptor 2PDINB into the PTB7-Th: N2200 binary polymer system can effectively increase the open-circuit voltage and the short-circuit current, and finally improve the efficiency of the ternary polymer solar cell device.

The preparation method of the ternary polymer solar cell device provided by the present invention is described above in detail. The non-fullerene PDI electron acceptor is added into the binary all-polymer system, so that the stacking of molecules can be effectively inhibited, the spectral absorption can be broadened, and the phase separation can be improved, thereby increasing the short-circuit current of the ternary polymer solar cell device, and increasing the efficiency of the ternary polymer solar cell device.

The above only describes preferred embodiments of the present invention. It should be pointed out that several improvements and modifications may be made by those ordinary skilled in the art without departing from the principle of the present invention. These improvements and modifications shall also be regarded as the protection scope of the present invention.

We claim:

1. A polymer solar cell, comprising a substrate layer, a transparent conductive cathode, a cathode buffer layer, a photoactive layer, an anode buffer layer and a metal anode successively from bottom to top, wherein a non-fullerene perylene diimide (PDI) electron acceptor is introduced into the photoactive layer; in the photoactive layer, a ratio of a weight percentage of a polymer electron donor, a polymer electron acceptor and the non-fullerene PDI electron acceptor is 1: (0-1): (0.1-1); the non-fullerene PDI electron acceptor is a compound containing no fullerene group but containing PDI groups; the non-fullerene PDI electron acceptor comprises 2PDINB; an absorbing band of the 2PDINB is between 300 nm and 900 nm; a structural formula of the 2PDINB is:

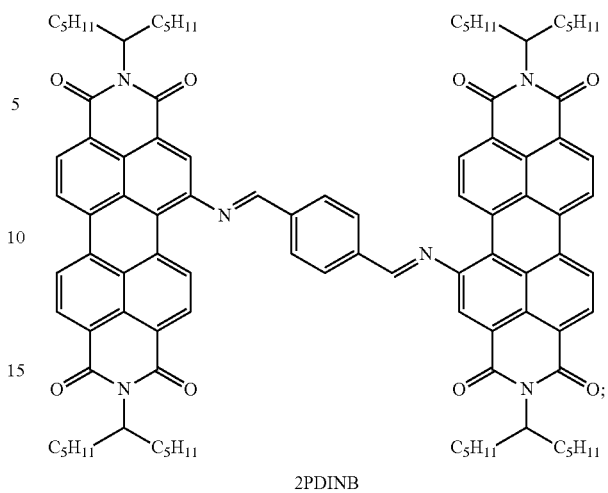

2PDINB a preparation method of the 2PDINB comprises: first, making the PDI and concentrated nitric acid react in dichloromethane for 2-4 h to generate PDI with nitro groups, then refluxing the PDI with nitro groups, iron powder and concentrated hydrochloric acid in tetrahydrofuran for 30-60 min to obtain PDI with amino groups, and finally, refluxing the PDI with amino groups, terephthalaldehyde and acetic acid in ethanol for 24-30 h to obtain 2PDINB.

2. The polymer solar cell according to claim 1, wherein the preparation method of the 2PDINB comprises specific steps as follows:
   1 dissolving 1 g of PDI into 20 mL of dichloromethane to obtain a reagent A; dissolving 3 mL of fuming concentrated nitric acid into 5 mL of dichloromethane to obtain a reagent B; cooling the reagent A in an ice bath for 10-20 min, and then dropwise adding the reagent B into the reagent A to obtain a mixed solution; stirring the mixed solution at 0° C. for 2-4 h; pouring the mixed solution into methanol; filtering, washing and drying the solution; purifying by silica column chromatography, spin drying and vacuum drying the solution to obtain dark red PDI with nitro groups;
   2 heating, refluxing and stirring 1.21 g of 1.50 mmol PDI with nitro groups, 175 mg of 3.14 mmol iron powder and 6 mL of concentrated hydrochloric acid in 50 mL of anhydrous tetrahydrofuran for 30-60 min; and then cooling, precipitating in deionized water, extracting, drying with anhydrous sodium sulfate, spin drying, then dissolving in chloroform, finally purifying by silica column chromatography, and concentrating by evaporation to obtain the PDI with amino groups; and
   3 refluxing 714 mg of 1.00 mmol PDI with amino groups, 281 mg of 2.1 mmol terephthalaldehyde and 5 mL of acetic acid in 40 mL of ethanol for 24-30 h; and cooling, extracting with water and dichloromethane, removing the acetic acid, drying with anhydrous sodium sulfate, spin drying, and finally purifying by silica column chromatography to obtain the 2PDINB.

3. The polymer solar cell according to claim 1, wherein in the photoactive layer, the material of the polymer electron donor is a narrow-band polymer electron donor which comprises any one of polythiophene derivatives, such as P3HT, PTB7-Th and PBDB-T.

4. The polymer solar cell according to claim 1, wherein in the photoactive layer, the material of the polymer electron acceptor is an n-type conjugated polymer electron acceptor containing naphthalimide; and the polymer electron acceptor comprises N2200.

5. The polymer solar cell according to claim 1, wherein the material of the anode buffer layer is an organic compound with hole transport capacity or electron blocking capacity or a metal oxide with hole transport capacity or electron blocking capacity; and a thickness of the anode buffer layer is ranged from 1 nm to 200 nm.

6. The polymer solar cell according to claim 1, wherein the material of the cathode buffer layer is an organic compound with electron transport capacity or hole blocking capacity or a metal oxide with electron transport capacity or hole blocking capacity; the cathode buffer layer comprises one or more of TPBi, BCP, Bphen, $Alq_3$, AZO, ZnO and $TiO_2$; and a thickness of the cathode buffer layer is ranged from 1 nm to 200 nm.

7. The polymer solar cell according to claim 1, wherein the material of the substrate layer is glass or a transparent polymer; the material of the transparent polymer is one or more of polyethylene, polymethylmethacrylate, polycarbonate, polyurethane, polyphthalimide, vinyl chloride resin and polyacrylic acid; and the material of the metal anode is any one of gold, silver, platinum, copper and aluminum.

8. The polymer solar cell according to claim 1, wherein the transparent conductive cathode is a conductive material that is transparent or translucent in a visible light zone; and the light transmittance of the transparent conductive cathode is greater than 50%.

* * * * *